United States Patent
Casagrande

(10) Patent No.: US 7,928,805 B2
(45) Date of Patent: Apr. 19, 2011

(54) BROADBAND FREQUENCY SYNTHESIZER FOR SUPPRESSING PARASITIC LOW FREQUENCY TRANSMISSIONS

(75) Inventor: Arnaud Casagrande, Lignières (CH)

(73) Assignee: The Swatch Group Research and Development Ltd, Marin (CH)

( * ) Notice: Subject to any disclaimer, the term of this patent is extended or adjusted under 35 U.S.C. 154(b) by 139 days.

(21) Appl. No.: 12/445,916

(22) PCT Filed: Oct. 3, 2007

(86) PCT No.: PCT/EP2007/060505
§ 371 (c)(1),
(2), (4) Date: Apr. 16, 2009

(87) PCT Pub. No.: WO2008/046741
PCT Pub. Date: Apr. 24, 2008

(65) Prior Publication Data
US 2010/0295624 A1    Nov. 25, 2010

(30) Foreign Application Priority Data

Oct. 16, 2006   (EP) .................................. 06122367

(51) Int. Cl.
*H03L 7/00*        (2006.01)
(52) U.S. Cl. .......... 331/16; 331/177 R; 331/179; 331/34
(58) Field of Classification Search .............. 331/16, 331/1 A, 34, 177 R, 179
See application file for complete search history.

(56) References Cited

U.S. PATENT DOCUMENTS

| 7,116,747 | B2 | 10/2006 | Casagrande |
| 2003/0109237 | A1 | 6/2003 | Chien et al. |
| 2003/0227301 | A1 | 12/2003 | Lee |
| 2004/0239434 | A1 | 12/2004 | Casagrande |

FOREIGN PATENT DOCUMENTS

| CA | 2 267 496 | 9/1999 |
| EP | 1 300 950 | 4/2003 |
| JP | 2005-033581 | 2/2005 |

OTHER PUBLICATIONS

International Search Report issued in corresponding application No. PCT/EP2007/060505, completed Jan. 17, 2008 and mailed Feb. 20, 2008.

*Primary Examiner* — Arnold Kinkead
(74) *Attorney, Agent, or Firm* — Griffin & Szipl, P.C.

(57) ABSTRACT

A broadband frequency synthesizer including a VCO for supplying a high frequency output signal, a dual mode divider circuit, a means for selecting a division mode of the divider circuit, a phase detector and a low pass filter. The divider circuit divides the frequency of the output signal by a first division facto N1 in a first mode M1or by a second factor N2 different from the first factor N1 in a second mode M2 to provide the divided frequency signal (Fdiv). The selection means selects by determined time period the first or second division mode of the divider circuit as a function of the programmed frequency of the output signal in the frequency band defined by the first and second division factors N1 and N2. If this frequency is dose to the center of the frequency band, the dual mode divider divides the output signal frequency by a third factor N3 in a first mode M1 or by a fourth division factor N4. different from N3, in a second mode M2 according to the programming of the selection means.

8 Claims, 2 Drawing Sheets

BROADBAND FREQUENCY SYNTHESIZER FOR SUPPRESSING PARASITIC LOW FREQUENCY TRANSMISSIONS

This is a National Phase Application in the United States of International Patent Application No. PCT/EP2007/060505 filed Oct. 3, 2007, which claims priority on European Patent Application No. 06122367.3, filed Oct. 16, 2006. The entire disclosures of the above patent applications are hereby incorporated by reference.

FIELD OF THE INVENTION

The invention concerns a broadband frequency synthesizer capable of suppressing low frequency transmissions or components mainly for an output signal frequency close to the centre of the synthesizer frequency band. The phase-lock loop synthesizer includes a voltage controlled oscillator for providing at least one high frequency output signal. The frequency of this high frequency signal is divided in a dual mode divider circuit by a first division factor N1 in a first selected mode or by a second division factor N2 different from the first factor N1 in a second selected mode. A phase detector of the synthesizer compares a reference frequency signal with the divided frequency signal provided by the divider circuit. The phase detector is followed by a low-pass filter for filtering the output signal of the phase detector for providing a filtered control signal to the voltage controlled oscillator. A division mode selection means controls the divider circuit to select the first or second division mode of the divider circuit by determined time period. This mode selection means defines a mean of the first and second division modes in time as a function of the programmed output signal frequency of the voltage controlled oscillator.

BACKGROUND OF THE INVENTION

Frequency synthesizers can be used in particular in wireless communication systems, or, more generally, in telecommunications systems. These frequency synthesizers supply high frequency signals within a determined frequency band so as to cover a telecommunication band, such as the American ISM band (902 to 928 MHz) for example. In order to obtain the desired output frequency at the voltage controlled oscillator output, a binary selection signal, provided by the mode selection means, commands a series of selected modes in the divider circuit in a determined order. In a first mode M1 equal to 0, the output signal frequency of the voltage controlled oscillator is divided by a first division factor of the divider circuit, whereas in a second mode M2 equal to 1, a division is carried out by a second division factor of the divider circuit.

When a synthesizer output signal frequency close to the centre of the frequency band is selected, problems are generally encountered linked with parasitic or interference from low frequency transmissions or components. These parasitic transmissions can disturb the synthesizer output signal. The same is true for a frequency selected at the low and high limits of the synthesizer frequency band, but generally the synthesizer is provided with a larger frequency bandwidth than the communication frequency band. Consequently, problems of parasitic transmissions essentially concern the centre of the band.

Problems of parasitic low frequency transmissions mainly occur in the series of modes in time carried out via the programmed mode selection means, which may preferably be a sigma-delta type modulator. A modulator of the sigma-delta type defines a series of modes in accordance with a pseudo-random configuration in a binary selection signal controlling the divider circuit. This mode equals 0 and mode equals 1 series is dependent upon a programming signal received from the selected frequency of the voltage controlled oscillator output signal.

For this type of sigma-delta modulator, normally the mode equals 1 and mode equals 0 variation in the mode series is at a higher frequency than the low-pass filter cut-off frequency. This allows noise to be pushed towards the high frequencies, which are filtered. However, for a programmed output signal frequency close to the centre of the band, the mode equals 0 number is substantially equal to the mode equals 1 number. Depending upon the periodicity of 0 and 1 in the binary signal mode series, a 1 may sometimes occur in place of a 0, or a 0 in place of a 1. This results in a low frequency at each occurrence of 1 or 0 in the mode series over time. These rare occurrences of 1 or 0 in the binary signal mode series are thus not filtered by the low-pass filter, which disturbs the voltage controlled oscillator.

These problems of parasitic low frequency transmissions are the same for an output signal frequency that is chosen at the bottom or top limit of the frequency band. In such case, a 1 might rarely occurs among all the 0s of the mode series for a frequency at the bottom limit of the frequency band, or rarely a 0 among all the 1s for a frequency at the top limit of the frequency band. However, since the determined frequency band of the frequency synthesizer is generally broader than the telecommunications frequency band, a frequency close to the bottom and top limits of the frequency band will never be programmed. Consequently, the main problem of parasitic transmissions relates to the programming of a voltage controlled oscillator frequency close to the centre of the frequency band.

In order to try to reduce problems linked to parasitic low frequency components, it is known to inject random noise into the sigma-delta type phase-lock loop. However, this practice has the drawback of only partially suppressing these parasitic or interfering components, and also has the drawback of adding broadband noise to the useful frequency synthesizer signal.

A noise reduction frequency synthesizer is known from US Patent No. 2003/0227301. This frequency synthesizer is based on a conventional phase-lock loop (PLL), and the use of a sigma-delta modulator, which selects the division ratio of a multi-mode divider. One object of this synthesizer is to resolve the problem of dead bands, when the division factor is chosen to be equal to N or N+1. This synthesizer thus includes a first divider block for dividing the reference frequency of an oscillator, a second divider block for dividing, by a selected factor, the frequency of the high frequency signals of a voltage controlled oscillator, and a division ratio controller having a sigma-delta modulator. The second divider block divides the frequency of the high frequency signals by a first factor N or by a second factor N+1 or by a third factor N+2. Selection of the division factor is performed as a function of a selection signal provided by the sigma-delta modulator combined with a mode controller. Owing to a succession of modes over time between the three division factors that can be selected, it is possible to reduce the quantification noise.

However, configuring this frequency synthesizer in order to remove parasitic transmissions or components for a programmed frequency of an output signal close to the centre of the synthesizer frequency band is not envisaged. Moreover, mode switching is carried out over time by continuously using three division factors of the second divider block, which is thus controlled by 2 bit selection signals, which consumes a large amount of electric energy and is relatively complicated to implement.

SUMMARY OF THE INVENTION

It is thus an object of the invention to provide a broadband frequency synthesizer able easily to remove low frequency transmissions mainly for a frequency of the voltage controlled oscillator output signal close to the centre of the frequency band while overcoming the drawbacks of the state of the art cited hereinbefore.

The invention therefore concerns a broadband frequency synthesizer including in a phase-lock loop:
- a voltage controlled oscillator for providing at least one high frequency output signal within a determined frequency band,
- a dual mode divider circuit for dividing the output signal frequency by a first factor N1 in a first selected mode M1 or by a second factor N2 different from the first factor N1 in a second selected mode M2 in order to supply a divided frequency signal,
- a means for selecting the division mode of the divider circuit for selecting by determined time period the first division mode or the second division mode of the divider circuit in order to define a mean of first division mode M1 and second division mode M2 over time as a function of the programmed frequency of the output signal of the voltage controlled oscillator in the frequency band defined by the first and second division factors N1 and N2,
- a phase detector for comparing a reference frequency signal to the divided frequency signal provided by the divider circuit, and
- a low-pass filter for filtering the output signal of the phase detector to provide a filtered control signal to the voltage controlled oscillator, wherein when the frequency of the output signal is close to the centre of the frequency band defined by the first and second division factors N1 and N2, the dual mode divider circuit is configured for dividing the output signal frequency by a third factor N3 in a first selected mode M1 or by a fourth division factor N4 different from the third factor N3 in a second selected mode M2 according to a programming of the selection means, at least the third division factor N3 or the fourth division factor N4 being different from the first or second division factors N1 and N2, so as to shift the centre of the frequency band defined by the third and fourth factors N3 and N4 relative to the programmed frequency of the output signal.

Additional, particular advantageous, embodiments of the invention are provided in accordance with the following subsidiary broadband frequency synthesizers.

In accordance with a second broadband frequency synthesizer of the invention, the first embodiment is modified so that the dual mode divider circuit includes a first divider block for dividing the frequency of the output signal of the voltage controlled oscillator by the first division factor N1 or by the second division factor N2 as a function of the mode selected, and a second divider block for dividing, in place of the first divider block, the output signal frequency by the third division factor N3 or by the fourth division factor N4 as a function of the mode selected, when the output signal frequency is close to the centre of the determined frequency band or close to the bottom and top limits of said frequency band.

In accordance with a third broadband frequency synthesizer of the invention, the second embodiment is modified so that the dual mode divider circuit includes a switch element for selecting the first divider block or the second divider block on the basis of a received control signal, which is a function of the position of the programmed frequency of the voltage controlled oscillator in the frequency band. In accordance with a fourth broadband frequency synthesizer of the invention, the third embodiment is modified so that the switch element is arranged at the input of the dual mode divider circuit for receiving the output signal from the voltage controlled oscillator and supplying said output signal either to the first divider block or to the second divider block on the basis of the received control signal. In accordance with a fifth broadband frequency synthesizer of the invention, the third embodiment is modified so that the switch element is arranged between an electric supply terminal of a voltage source and a corresponding electric supply terminal of each divider block receiving the output signal from the voltage controlled oscillator, for supplying the electric power either to the first divider block, or to the second divider block on the basis of the received control signal.

In accordance with a sixth broadband frequency synthesizer of the invention, the first embodiment is modified so that the division mode selection means is a sigma-delta modulator with 1 bit of quantification, which is clocked by the divided frequency signal supplied by the divider circuit. In accordance with a seventh broadband frequency synthesizer of the invention, the first embodiment is modified so that the first factor N1 is equal to N, which is an integer number greater than or equal to 2, wherein the second factor N2 is equal to N+M, where M is an integer number greater than or equal to 1, in that the third factor is equal to N, and in that the fourth factor is equal to N+M+1. In accordance with an eighth broadband frequency synthesizer of the invention, the first embodiment is modified so that the first factor N1 is equal to N, which is an integer number greater than or equal to 2, preferably equal to 69, wherein the second factor N2 is equal to N+M, preferably equal to 72, where M is an integer number greater than or equal to 3, in that the third factor is equal to N+1, and in that the fourth factor is equal to N+M.

One advantage of the frequency synthesizer according to the invention lies in the fact that it can remove parasitic low frequency transmissions or components causing interference for any frequency selected within the synthesizer frequency band with a divider circuit that always operates in double mode. A couple of division factors is always used in the phase-lock loop compared to a frequency synthesizer which continuously uses three division factors as in US Patent Application No. 2003/0227301. A saving of electrical energy is thus achieved, and this synthesizer is much simpler to make.

If the programmed frequency is in an intermediate zone between the bottom limit or the top limit and the centre of the frequency band, the divider circuit can divide the output signal frequency by a first factor N1 in a first selected mode or by a second factor N2 in a second selected mode. The different value of the first and second division factors N1 and N2 defines the determined frequency band of the synthesizer.

However, if the programmed frequency is close to the centre of the determined frequency band, for example within a margin of ±5% around the centre of the band, the dual mode divider circuit is configured to divide the output signal frequency by a third factor N3 in a first selected mode or by a fourth factor N4 in a second selected mode by the mode selection means. Normally, either the third factor N3, or the fourth factor N4 has a different value from the first factor N1 or from the second factor N2. For a programmed frequency close to the centre of the determined band, this allows the band centre to be shifted on the basis of the third and fourth division factors, and thus removes the parasitic low frequency components causing interference.

Advantageously, the divider circuit includes a first divider block for dividing the output signal frequency by the first or second division factor according to the mode selected, and a second divider block for dividing the output signal frequency by the third or fourth division factor according to the mode selected. A switch element of the divider circuit allows either the first divider block or the second divider block to be selected, as a function of a received control signal that depends upon the position of the selected frequency in the frequency band.

Advantageously, the frequency synthesizer can carry out broadband sigma-delta type frequency synthesis using a sigma-delta type modulator as mode selection means. The sigma-delta type modulator supplies a binary selection signal (1 bit) to the dual mode divider circuit.

BRIEF DESCRIPTION OF THE DRAWINGS

The objects, advantages and features of the broadband frequency synthesizer will appear more clearly in the following description of a non limiting embodiment with reference to the drawings, in which.

DETAILED DESCRIPTION OF THE ILLUSTRATIVE EMBODIMENTS

In the following description, all of the elements of the broadband or wideband frequency synthesizer that are well known to those skilled in the art in this technical field will be related only in a simplified manner.

Figure 1:
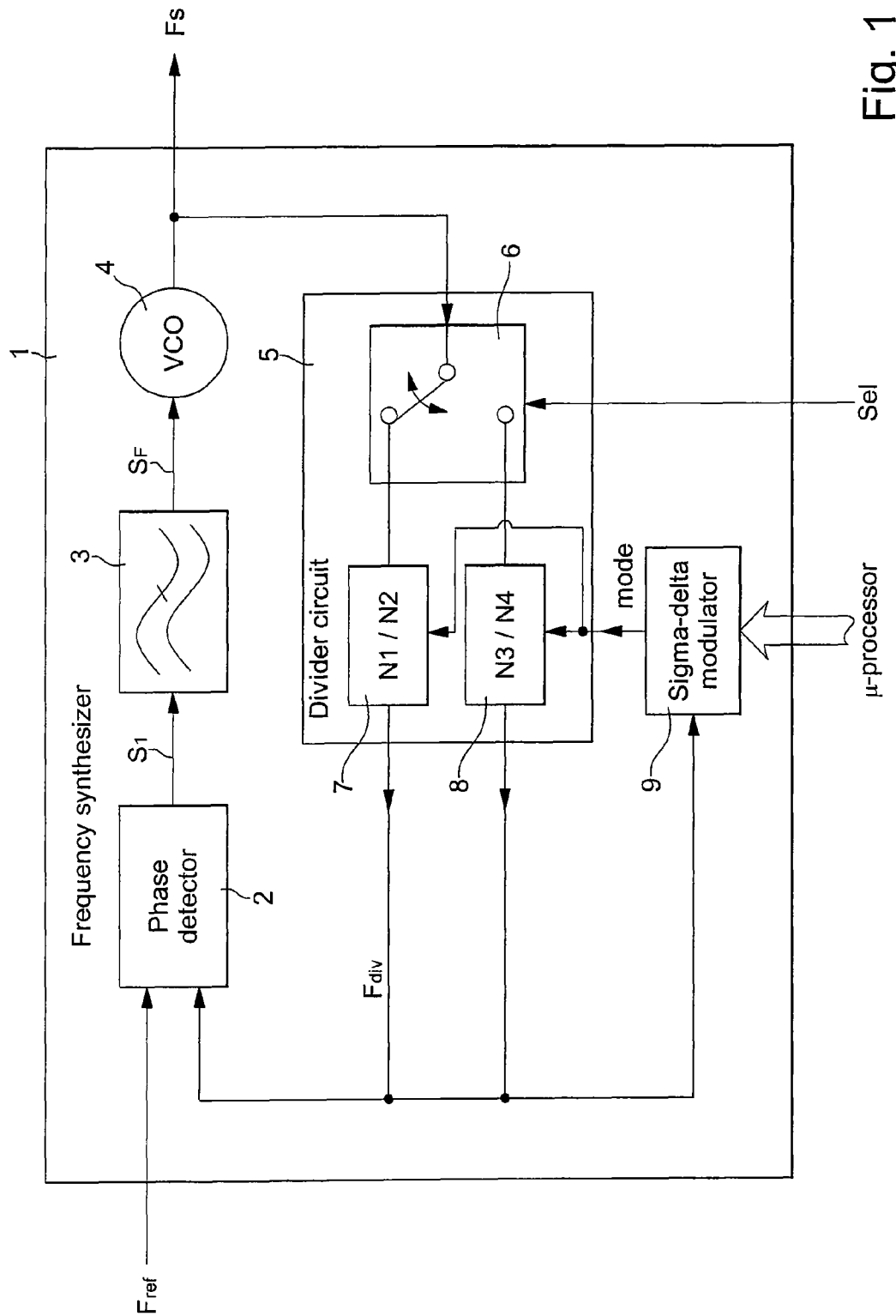
FIG. 1 shows, in a simplified manner, the various elements that form the broadband frequency synthesizer according to the invention.

FIG. 1 schematically illustrates all of the elements of one embodiment of a broadband frequency synthesizer 1 which can be used in a telecommunications system. This frequency synthesizer 1 includes in a phase-lock loop, a phase detector 2, a low-pass filter 3, a voltage controlled oscillator (VCO) 4, and a dual mode divider circuit 5 controlled by a mode selection means 9. The phase detector 2 compares a reference signal $F_{ref}$ with a stable frequency, for example 13 MHz, supplied by a conventional reference oscillator which is not shown, to a divided frequency signal $F_{div}$, supplied by divider circuit 5. The output signal of detector $S_1$ is filtered by low-pass filter 3, which preferably has a cut-off frequency of 100 kHz, in order to provide a filtered control signal $S_F$ to voltage controlled oscillator 4. On the basis of this control signal $S_F$, the voltage controlled oscillator 4 produces a high frequency output signal $F_S$, whose frequency is comprised within a determined frequency band of the synthesizer.

The dual mode divider circuit 5 mainly includes a first dual mode divider block 7. This first divider block can be composed, in a known manner, of one or several dividers by 2 or by 3 of synchronous and/or asynchronous type. This first divider block divides the frequency of the high frequency output signal $F_S$ of voltage controlled oscillator 4 by a first factor N1 in a first selected mode M1 or by a second factor N2 different from first factor N1 in a second selected mode M2.

The value of first factor N1 is equal to N, which is preferably an integer number greater than or equal to 2, and the value of the second factor N2 is equal to N+M, where M is an integer number greater than or equal to 1, for example equal to 3.

The first and second division factors N1 and N2 define, in the phase-lock loop, a determined frequency band of the frequency synthesizer to cover the desired communication frequency band. With a first factor N1 for example equal to 69 (N) and a second factor N2 for example equal to 72 (N+M), this defines a frequency band from 897 to 936 MHz with a reference signal $F_{ref}$ whose frequency is equal to 13 MHz. This synthesizer 1 can be used for frequency synthesis for example in the American ISM band from 902 to 928 MHz.

The frequency chosen in the frequency band of output signal $F_S$ of voltage controlled oscillator 4 is obtained on the basis of a programming signal for mode selection means 9 of dual mode divider circuit 5. This programming signal, which can be a binary programming word, is provided by a conventional microprocessor that is not shown. The programmed mode selection means of divider circuit 5 selects per determined time period the first division mode M1 or the second division mode M2 of the divider circuit. This defines a mean of first and second division modes M1 and M2 of the synthesizer over time or a mean mainly of first and second division factors N1 and N2. This mean is a function of the programmed frequency $F_S$ of the output signal of voltage controlled oscillator 4 in the determined frequency band.

The mode selection means 9 is preferably a conventional sigma-delta modulator, which normally returns the noise generated in the phase-lock loop to the high frequencies, which is filtered by low-pass filter 3. This sigma-delta modulator supplies a selection signal formed of a series of 0s and 1s respectively corresponding to the first M1 and second M2 selected modes of divider circuit 5. This series of 0s and is obtained in a pseudo-random configuration by clocking provided by the divided frequency signal $F_{div}$ of the divider circuit. Thus, as indicated above, as a function of the number of 1s relative to the number of 0s in the (mode) selection signal, a mean of modes over time can be determined. This mean thus defines a filtered control signal of the voltage controlled oscillator 4, so that it produces exactly the desired frequency $F_S$.

If the selected frequency $F_S$ is in an intermediate zone of the frequency band, i.e. between the bottom limit or the top limit and the centre of the band, dual mode divider circuit 5 carries out a frequency division using the first dual mode divider block 7. However, if this frequency is close to the centre of the band, for example within a margin of ±5% of 916.5 MHz in a frequency band of 897 to 936 MHz, the frequency spectrum upstream of the low-pass filter is charged with parasitic low frequency components. These low frequency components cannot be filtered by said low-pass filter 3, as indicated hereinafter with reference to FIG. 2. Consequently, this interferes with the control signal $S_F$ of the voltage controlled oscillator, which thus no longer has a well defined frequency, such as a Dirac in the frequency spectrum, of the high frequency output signal.

It should be noted that problems of interference from or parasitic low frequency components mainly occur in the series of modes over time performed by the sigma-delta type modulator as explained above. Normally, the variation in mode equals 1 and mode equals 0 in the mode selection signal is at a higher frequency than the low-pass filter cut-off frequency (100 kHz). However, for a programmed frequency of the output signal close to the centre of the band, the number of mode equals 0 is substantially equal to the number of mode equals 1. A 1 may sometimes occur in place of a 0, or a 0 in place of a 1. This results in a low frequency at each occurrence of 1 or 0 in the series of modes over time. These rare occurrences of 1s or 0s in the mode series of the binary selection signal are not therefore filtered by the low-pass filter, which interferes with the voltage controlled oscillator.

In order to remove the parasitic low frequency transmissions or components for an output signal frequency close to the centre of the band, divider circuit 5 includes a second dual mode divider block 8. This second divider block 8 is switched on in place of the first dual mode divider 7, when a programmed synthesizer frequency is detected to be close to the centre of the frequency band. This operating second divider block 8 divides the frequency of output signal $F_S$ by a third division factor N3 in the first selected mode M1 or by a fourth division factor N4 in the second selected mode M2. At least the third division factor N3 or the fourth division factor N4 are different from the first and/or second division factors N1 and N2. The value of third factor N3 may be equal to N like the value of first factor N1, whereas the value of the fourth factor N4 may be equal to N+M+1. However, the value of third factor N3 can also be equal to N+M like second factor N2.

The third and fourth division factors N3 and N4 define another frequency band that includes the desired frequency of output signal $F_S$. The centre of this other frequency band (for example 923 MHz) is thus shifted from the centre of the frequency band (for example 916.5 MHz) defined by the first and second division factors N1 and N2. Thus, the programmed frequency can be situated in one of the two intermediate parts of the other frequency band, which removes said parasitic components. The third and fourth division factors N3 and N4 can be respectively equal to 70 and equal to 72, relative to the first and second factors N1 and N2 respectively equal to 69 and equal to 72.

As a function of the position of the selected frequency of output signal $F_S$, in the frequency band of frequency synthesizer 1, the dual mode divider circuit 5 further includes a switch element 6 for selecting the first divider block 7 or the second divider block 8. In the embodiment shown in FIG. 1, this switch element 6 is arranged at the input of the divider circuit for receiving the high frequency output signal $F_S$. This switch element 6 is controlled by a control signal Sel, which is a function of the position of the selected frequency in the determined frequency band. For a frequency situated in one of the intermediate parts of the frequency band, switch element 6 supplies the output signal to be divided only to first divider block 7. However, for a frequency close to the centre of the frequency band, switch element 6 supplies the output signal to be divided only to the second divider block 8.

It should be noted that one could imagine placing a switch element 6 between an electric supply terminal of a voltage source and a corresponding electric supply terminal of each divider block 7, 8. This switch element may be formed for example by a conventional multiplexer. In such case, each divider block directly receives the output signal $F_S$ from voltage controlled oscillator 4. For the selection of one divider block or the other, switch element 6 will supply the electric power either to the first divider block or to the second divider block on the basis of control signal Sel.

Figure 2:
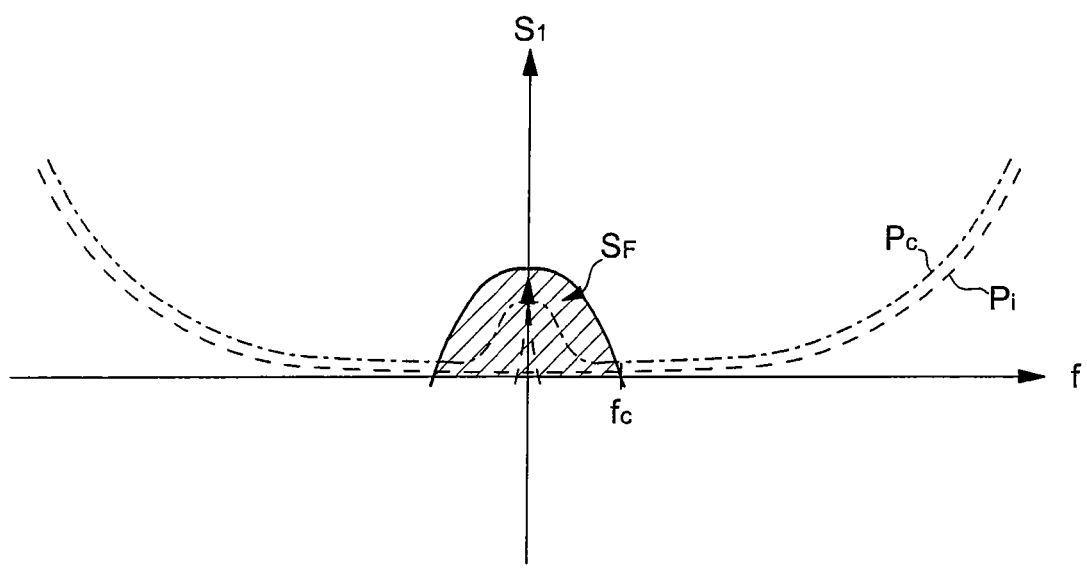
FIG. 2 shows, in a simplified manner, a graph of the spectrum of useful and parasitic signals to be filtered upstream of the low-pass filter of the frequency synthesizer with the problem of parasitic low frequency transmissions according to the programmed frequency of the voltage controlled oscillator output signal.

In order to illustrate the problems linked to interference from or parasitic low frequency transmissions in a simplified manner, reference is made to FIG. 2 showing in particular a graph of the spectrum of output signals $S_1$ of the phase detector. The hatched part of this graph defines the signals $S_F$ filtered by the low-pass filter, which has a cut-off frequency $f_c$ of the order of 100 kHz. The useful signals to be filtered are only illustrated by a triangular shape in dotted lines ending in an arrow in the hatched part. For the sake of simplification, only the envelope of interfering or parasitic signals Pc, Pi is shown.

For a programmed frequency close to the centre of the frequency band, the parasitic signals Pc (noise) include low frequency components, which are not filtered by the low-pass filter, and which are added to the useful signals. The high frequency part of these parasitic signals generated, in particular, by the sigma-delta modulator is filtered by the low-pass filter. Conversely, for a programmed frequency in one of the intermediate zones of the frequency band, the parasitic signals Pi do not include low frequency components and are thus well filtered by the low-pass filter.

Owing to the selection of the second dual mode divider block of the divider circuit in the case of a programmed frequency close to the centre of the band, it is thus possible to remove the parasitic low frequency components causing interference from signals Pc by generating parasitic signals like curve Pi.

From the description that has just been given, those skilled in the art can devise multiple variants of the broadband frequency synthesizer without departing from the scope of the invention defined by the claims. The mode selection means can be formed by a logic circuit with two counters clocked in synchronism by the same clock signal, but the number counted by each counter before zero reset is different. Selection of the second divider block of the divider circuit can also occur for a selected output signal frequency close to the bottom limit or the top limit of the synthesizer frequency band. Division factors which are not integer numbers as indicated in EP Patent No. 1 300 950 could also be envisaged. The divider circuit may comprise only one set of three factors of which only two division factors are selected depending upon the position of the selected frequency in the frequency band.

The invention claimed is:

1. A broadband frequency synthesizer including in a phase-lock loop:
    a voltage controlled oscillator for providing at least one high frequency output signal within a determined frequency band,
    a dual mode divider circuit for dividing the output signal frequency by a first factor N1 in a first selected mode M1 or by a second factor N2 different from the first factor N1 in a second selected mode M2 in order to supply a divided frequency signal,
    a means for selecting a division mode of the divider circuit for selecting by a determined time period a first division mode or a second division mode of the divider circuit in order to define a mean of first division mode M1 and second division mode M2 over time as a function of the programmed frequency of the output signal of the voltage controlled oscillator in the frequency band defined by the first and second division factors N1 and N2,
    a phase detector for comparing a reference frequency signal to the divided frequency signal provided by the divider circuit, and
    a low-pass filter for filtering the output signal of the phase detector to provide a filtered control signal to the voltage controlled oscillator,
    wherein when the frequency of the output signal is close to the centre of the frequency band defined by the first and second division factors N1 and N2, the dual mode divider circuit is configured for dividing the output signal frequency by a third factor N3 in a first selected mode M1 or by a fourth division factor N4 different from the third factor N3 in a second selected mode M2 according to a programming of the selection means, at least the third division factor N3 or the fourth division factor N4 being different from the first or second division factors N1 and N2, so as to shift the centre of the frequency band defined by the third and fourth factors N3 and N4 relative to the programmed frequency of the output signal.

2. The frequency synthesizer according to claim 1, wherein the dual mode divider circuit includes a first divider block for dividing the frequency of the output signal of the voltage controlled oscillator by the first division factor N1 or by the second division factor N2 as a function of the mode selected, and a second divider block for dividing, in place of the first divider block, the output signal frequency by the third division factor N3 or by the fourth division factor N4 as a function of the mode selected, when the output signal frequency is close to the centre of the determined frequency band or close to the bottom and top limits of said frequency band.

3. The frequency synthesizer according to claim 2, wherein the dual mode divider circuit includes a switch element for selecting the first divider block or the second divider block on the basis of a received control signal, which is a function of the position of the programmed frequency of the voltage controlled oscillator in the frequency band.

4. The frequency synthesizer according to claim 3, wherein the switch element is arranged at the input of the dual mode divider circuit for receiving the output signal from the voltage controlled oscillator and supplying said output signal either to the first divider block or to the second divider block on the basis of the received control signal.

5. The frequency synthesizer according to claim 3, wherein the switch element is arranged between an electric supply terminal of a voltage source and a corresponding electric supply terminal of each divider block receiving the output signal from the voltage controlled oscillator, for supplying the electric power either to the first divider block, or to the second divider block on the basis of the received control signal.

6. The frequency synthesizer according to claim 1, wherein the division mode selection means is a sigma-delta modulator with 1 bit of quantification, which is clocked by the divided frequency signal supplied by the divider circuit.

7. The frequency synthesizer according to claim 1, wherein the first factor N1 is equal to N, which is an integer number greater than or equal to 2, wherein the second factor N2 is equal to N+M, where M is an integer number greater than or equal to 1, in that the third factor is equal to N, and in that the fourth factor is equal to N+M+1.

8. The frequency synthesizer according to claim 1, wherein the first factor N1 is equal to N, which is an integer number greater than or equal to 2, preferably equal to 69, wherein the second factor N2 is equal to N+M, preferably equal to 72, where M is an integer number greater than or equal to 3, in that the third factor is equal to N+1, and in that the fourth factor is equal to N+M.

* * * * *